(12) United States Patent
Saito et al.

(10) Patent No.: US 10,461,214 B2
(45) Date of Patent: Oct. 29, 2019

(54) METHOD FOR PRODUCING GROUP III NITRIDE SEMICONDUCTOR LIGHT-EMITTING DEVICE

(71) Applicant: TOYODA GOSEI CO., LTD., Kiyosu-shi (JP)

(72) Inventors: Yoshiki Saito, Kiyosu (JP); Daisuke Shinoda, Kiyosu (JP)

(73) Assignee: TOYODA GOSEI CO., LTD., Kiyosu-Shi, Aichi-Ken (JP)

( * ) Notice: Subject to any disclaimer, the term of this patent is extended or adjusted under 35 U.S.C. 154(b) by 0 days.

(21) Appl. No.: 15/846,379

(22) Filed: Dec. 19, 2017

(65) Prior Publication Data
US 2018/0182915 A1 Jun. 28, 2018

(30) Foreign Application Priority Data
Dec. 26, 2016 (JP) ................................ 2016-252005

(51) Int. Cl.
*H01L 33/00* (2010.01)
*H01L 21/02* (2006.01)
*H01L 33/32* (2010.01)

(52) U.S. Cl.
CPC ...... *H01L 33/0075* (2013.01); *H01L 21/0254* (2013.01); *H01L 21/0262* (2013.01); *H01L 21/02389* (2013.01); *H01L 21/02488* (2013.01); *H01L 33/32* (2013.01); *H01L 21/02178* (2013.01); *H01L 21/02241* (2013.01); *H01L 21/02499* (2013.01); *H01L 21/02516* (2013.01); *H01L 21/02658* (2013.01)

(58) Field of Classification Search
None
See application file for complete search history.

(56) References Cited

U.S. PATENT DOCUMENTS

| | | | | |
|---|---|---|---|---|
| 2010/0031875 A1* | 2/2010 | D'Evelyn | ............... | B01J 3/008 117/71 |
| 2012/0319162 A1* | 12/2012 | Araki | ................. | H01L 21/0237 257/103 |

FOREIGN PATENT DOCUMENTS

| | | |
|---|---|---|
| JP | 2016-141575 A | 8/2006 |
| JP | 2015-042598 A | 3/2015 |
| JP | 5898347 B2 | 4/2016 |

* cited by examiner

*Primary Examiner* — Anthony Ho
*Assistant Examiner* — Kevin Quinto
(74) *Attorney, Agent, or Firm* — McGinn I.P. Law Group, PLLC.

(57) ABSTRACT

To provide a method for producing a Group III nitride semiconductor light-emitting device using a substrate containing Al such as AlN substrate while suppressing polarity inversion. The production method comprising an oxide film formation step, a first Group III nitride layer formation step, a first semiconductor layer formation step, a light-emitting layer formation step, and a second semiconductor layer formation step. In the production method, an AlN substrate or AlGaN substrate is employed. In the oxide film formation step, an oxide film containing Al atoms, N atoms, and O atoms is formed. In the first Group III nitride layer formation step, an AlN layer or AlGaN layer is formed as the first Group III nitride layer under the condition that the substrate temperature 1200° C. to 1450° C.

12 Claims, 2 Drawing Sheets

METHOD FOR PRODUCING GROUP III NITRIDE SEMICONDUCTOR LIGHT-EMITTING DEVICE

BACKGROUND OF THE INVENTION

Field of the Invention

The present techniques relate to a method for producing a Group III nitride semiconductor light-emitting device.

Background Art

When a semiconductor device having a Group III nitride semiconductor layer is produced, an AlN layer is formed on a sapphire substrate in some cases. In that case, many threading dislocations are generated at an interface between a sapphire substrate and an AlN layer. The crystallinity of the semiconductor layer with high threading dislocation density is not so high.

Therefore, a template substrate produced through Hydride Vapor Phase Epitaxy (HVPE) or a free-standing bulk substrate has been employed in recent years. However, needless to say, these substrates are taken out from the production device after the production. At that time, an oxide film is formed on the surface of the substrate. Such oxide film may cause various problems on the semiconductor layers being formed on the top layer of the substrate.

The effect of oxidation of the AlN substrate will be described below.

Firstly, the case where the AlN substrate is not oxidized will be described. In the case where there are no oxygen atoms on a top surface of the AlN substrate, a pair of a plane on which Al atoms are distributed and a plane on which N atoms are distributed is repeatedly arranged in a c-axis direction.

Subsequently, the case where the top surface of the AlN substrate is naturally oxidized by the atmosphere will be described. A part of N atoms are replaced with oxygen atoms through natural oxidation of the surface of the AlN substrate. That is, AlON is partially formed on the substrate through oxidation of AlN. When oxygen atoms enter AlN, for example, —Al—N—Al—O—Al—O— bond is formed along the c-axis direction. This Al—O—Al bond inverts the polarity. In a semiconductor layer being grown on the top layer of the substrate, a portion where Group III polar surface is dominant and a portion where nitrogen polar surface is dominant are generated on account of partial oxidation. As a result, the crystallinity of the semiconductor layer being grown on the substrate is relatively low. It is difficult to produce a high performance semiconductor light-emitting device. The techniques to improve the crystallinity of the AlN film are disclosed in, for example, Japanese Patent Application Laid-Open (kokai) No. 2015-42598.

SUMMARY OF THE INVENTION

The present techniques have been conceived to solve the aforementioned problems involved in conventional techniques. Thus, an object of the present techniques is to provide a method for producing a Group III nitride semiconductor light-emitting device in which a semiconductor layer is grown using a substrate containing Al such as AlN substrate while suppressing polarity inversion.

In a first aspect of the present techniques, there is provided a method for producing a Group III nitride semiconductor light-emitting device, the method comprising an oxide film formation step of forming an oxide film on a substrate, a first Group III nitride layer formation step of forming a first Group III nitride layer on the oxide film, a first semiconductor layer formation step of forming a first conductive type first semiconductor layer on the first Group III nitride layer, a light-emitting layer formation step of forming a light-emitting layer on the first semiconductor layer, and a second semiconductor layer formation step of forming a second conductive type second semiconductor layer on the light-emitting layer. In the production method, an AlN substrate or AlGaN substrate is employed as the substrate. In the oxide film formation step, the oxide film containing Al atoms, N atoms, and O atoms is intentionally and uniformly formed on the entire surface of the substrate as the oxide film. In the first Group III nitride layer formation step, the AlN layer or AlGaN layer is formed as the first Group III nitride layer under the condition that the substrate temperature is 1200° C. to 1450° C. The substrate temperature is preferably 1350° C. to 1450° C.

In the method for producing a Group III nitride semiconductor light-emitting device, the oxide film inverts the polarity of the semiconductor layer grown on the oxide film from the polarity of the substrate. The oxide film is a polarity inversion layer. In one semiconductor layer, a portion where Group III polarity is dominant and a portion where nitrogen polarity is dominant are hardly generated because the oxide film is intentionally and uniformly formed on the entire surface of the substrate. The substrate temperature is set at the temperature of 1200° C. to 1450° C. higher than the conventional temperature when forming the first Group III nitride layer. Thus, the first Group III nitride layer is formed so that the Group III polar surface is dominant, thereby growing a semiconductor layer superior in crystallinity.

A second aspect of the techniques is directed to a specific embodiment of the method for producing a Group III nitride semiconductor light-emitting device, wherein in the oxide film formation step, AlON or AlGaON is formed as the oxide film, and the polarity is inverted between the substrate and the first Group III nitride layer formed on the oxide film by the oxide film.

A third aspect of the techniques is directed to a specific embodiment of the method for producing a Group III nitride semiconductor light-emitting device, wherein in the oxide film formation step, the oxide film is formed on a −c plane of the substrate.

The present techniques, disclosed in the specification, provide a method for producing a Group III nitride semiconductor light-emitting device in which a semiconductor layer is grown using a substrate containing Al such as AlN substrate while suppressing polarity inversion.

BRIEF DESCRIPTION OF THE DRAWINGS

Various other objects, features, and many of the attendant advantages of the present techniques will be readily appreciated as the same becomes better understood with reference to the following detailed description of the preferred embodiments when considered in connection with the accompanying drawings, in which.

DETAILED DESCRIPTION OF PREFERRED EMBODIMENT

Figure 1:
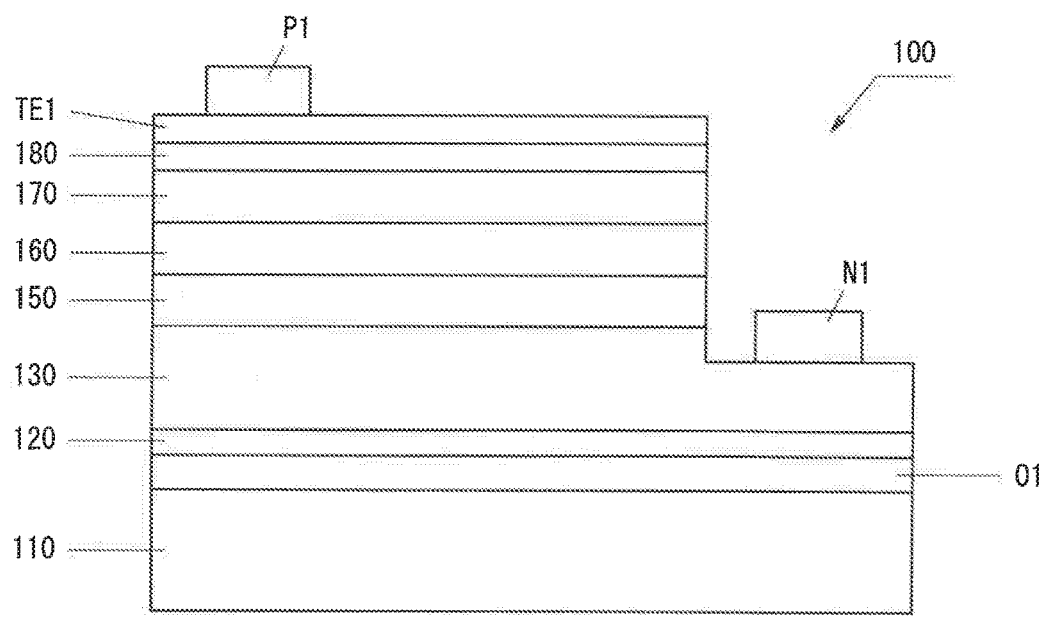
FIG. 1 is a schematic view of the structure of a light-emitting device according to a first embodiment.

With reference to the drawings, specific embodiments of the semiconductor light-emitting device of the present technique and the production method therefor will next be described in detail. However, these embodiments should not be construed as limiting the techniques thereto. The below-described deposition structure of the layers of the semiconductor light-emitting device and the electrode structure are given only for the illustration purpose, and other deposition structures differing therefrom may also be employed. The thickness of each of the layers shown in the drawings is not an actual value, but a conceptual value.

First Embodiment

1. Semiconductor Light-Emitting Device

FIG. 1 is a schematic view of the structure of a light-emitting device 100 according to a first embodiment. As shown in FIG. 1, the light-emitting device 100 is a face-up type semiconductor light-emitting device. The light-emitting device 100 has a plurality of Group III nitride semiconductor layers. The light-emitting device 100 is also an ultraviolet light-emitting device.

As shown in FIG. 1, the light-emitting device 100 has a substrate 110 whose surface polarity is −c, an oxide film O1, a first Group III nitride layer 120, an n-type contact layer 130, an n-side cladding layer 150, a light-emitting layer 160, a p-side cladding layer 170, a p-type contact layer 180, a transparent electrode TE1, an n-electrode N1, and a p-electrode P1.

The n-type contact layer 130 and the n-side cladding layer 150 are n-type semiconductor layers. The n-type semiconductor layer is a first conductive type first semiconductor layer. The p-side cladding layer 170 and the p-type contact layer 180 are p-type semiconductor layers. The p-type semiconductor layer is a second conductive type second semiconductor layer. The n-type semiconductor layer may include an ud-GaN not doped with a dormer or a similar layer. The p-type semiconductor layer may include an ud-GaN not doped with an acceptor or a similar layer.

The substrate 110 is an AlN substrate. In FIG. 1, the main surface of the substrate 110 is flat. The main surface of the substrate 110 may have an uneven structure.

The oxide film O1 is formed on and in direct contact with the main surface of the substrate 110. The oxide film O1 is an oxide film obtained through oxidation of AlN of the substrate 110. The oxide film O1, for example, $Al_2O_3$ or $AlO_xN_y$, is obtained by uniformly oxidizing AlN. When the substrate 110 is made of AlGaN, the oxide film O1 is $Al_aGa_bO_xN_y$. The thickness of the oxide film O1 is preferably in a range from larger than 2 nm to not larger than 100 nm, more preferably in a range from 3 nm to 100 nm. The oxide film O1 can be uniformly formed on the entire surface of the substrate 110 in these thickness ranges. The thickness ranges are also enough to perfectly convert the polarity of the first Group III nitride layer 120 formed on the oxide film O1 from the polarity of the substrate.

The first Group III nitride layer 120 is formed in direct contact with the oxide film O1. The first Group III nitride layer 120 is an intermediate layer disposed between the oxide film O1 and the n-type contact layer 130. The first Group III nitride layer 120 made of, for example, AlN or AlGaN. In a case of AlGaN the oxide film O1 is more effective for conversion of the polarity in the Al composition molar ratio not smaller than 0.5.

If the oxidization of the substrate 110 is not uniform and perfect on the entire surface, a portion where Al or Ga polar surface (+c) is dominant and a portion where nitrogen polar surface (−c) is dominant are generated in a mixed mode. Even in this case the AlGaN having +c polarity with a smaller molar ratio of Al can laterally grow over the AlGaN having −c polarity in a higher temperature. As a result if we thickly grow AlGaN, the AlGaN having +c polarity can be obtained on the entire surface of the substrate 110.

However since it is difficult that the AlGaN with the Al composition molar ratio not smaller than 0.5 laterally grows even in a higher temperature. As result the oxide film O1 is especially effective to obtain a uniform polarity of AlGaN on the entire surface of the substrate 110 in a case of growing the AlGaN with the Al composition molar ratio not smaller than 0.5.

The n-type contact layer 130 is provided to form an ohmic contact with the n-electrode N1. The n-type contact layer 130 is formed in direct contact with the first Group III nitride layer 120. The n-electrode N1 is disposed on the n-type contact layer 130. The n-type contact layer 130 is made of, for example, n-type GaN.

The n-side cladding layer 150 is a strain relaxation layer for relaxing the stress applied to the light-emitting layer 160. The n-side cladding layer 150 is formed on the n-type contact layer 130. The n-side cladding layer 150 is formed through depositing, for example, Si-doped AlGaN layers. Needless to say, the semiconductor may be made of semiconductor layers having other composition.

The light-emitting layer 160 emits light through recombination of an electron with a hole. The light-emitting layer 160 is formed on the n-side cladding layer 150. The light-emitting layer 160 is formed through repeatedly depositing layer units each formed by depositing a well layer and a barrier layer. That is, the light-emitting layer 160 has a multiple quantum-well (MQW) structure. The light-emitting layer 160 may have a cap layer formed on the well layer. The light-emitting layer 160 may have a single quantum-well structure.

The p-side cladding layer 170 is formed on the light-emitting layer 160. The p-side cladding layer 170 is formed through depositing p-type AlGaN layers. Needless to say, the semiconductor may be made of semiconductor layers having other composition.

The p-type contact layer 180 is provided to form an Ohmic contact with the transparent electrode TE1. The p-type contact layer 180 is formed on the p-side cladding layer 170. The P-type contact layer 180 is made of, for example, $Al_YGa_{1-Y}N$ ($0 \leq Y \leq 1$).

The transparent electrode TE1 is provided to diffuse current in a light-emitting surface. The transparent electrode TE1 is formed on the p-type contact layer 180. The transparent electrode TE1 is preferably made of at least one selected from a group consisting of ITO, IZO, ICO, ZnO, $TiO_2$, $NbTiO_2$, $TaTiO_2$, and $SnO_2$.

The p-electrode P1 is formed on the transparent electrode TE1. The p-electrode P1 is formed by combining at least one selected from a group consisting of Ni, Au, Ag, Co, and others. Needless to say, other composition may be used. The p-electrode P1 is conductive with the p-type semiconductor layer.

The n-electrode N1 is formed on the n-type contact layer 130. The n-electrode N1 is formed by combining at least one selected from a group consisting of Ni, Au, Ag, Co, V, Al, and others. Needless to say, other composition may be used. The n-electrode N1 is conductive with the n-type semiconductor layer.

The light-emitting device 100 may include a protective film for protecting the semiconductor layer.

2. Oxide Film

2-1. Peripheral Structure of Oxide Film

Figure 2:
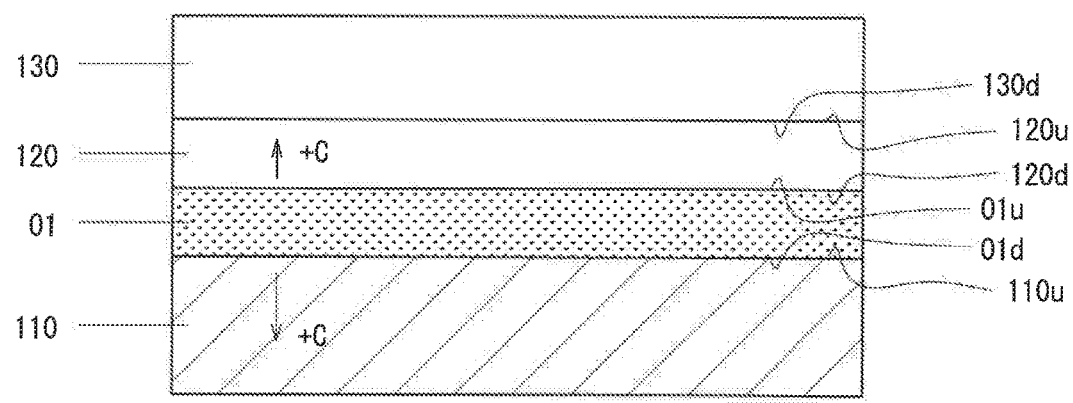
FIG. 2 is an enlarged view of the periphery of an oxide film in the light-emitting device according to the first embodiment.

FIG. 2 is an enlarged view drawn by extracting the periphery of the oxide film O1. As shown in FIG. 2, the substrate 110 has a main surface 110$u$. The oxide film O1 has a bottom surface O1$d$ and a top surface O1$u$. The first Group III nitride layer 120 has a bottom surface 120$d$ and a top surface 120$u$. The n-type contact layer 130 has a bottom surface 130$d$.

As shown in FIG. 2, the bottom surface O1$d$ of the oxide film O1 is in direct contact with the main surface 110$u$ of the substrate 110. The top surface O1$u$ of the oxide film O1 is in direct contact with the bottom surface 120$d$ of the first Group III nitride layer 120. The top surface 120$u$ of the first Group III nitride layer 120 is in direct contact with the bottom surface 130$d$ of the n-type contact layer 130.

2-2. Polarity Inversion in Oxide Film

The oxide film O1 is a polarity inversion layer. Firstly, the case where there are no oxygen atoms on the AlN substrate will be described. When there are no oxygen atoms, a pair of a plane on which Al atoms are distributed and a plane on which N atoms are distributed is repeatedly arranged in a c-axis direction. When the surface of the AlN substrate is uniformly and evenly oxidized, N atoms on the surface of the substrate are placed with O atoms, and an Al—O covalent bond is generated. At this time, O and Al crystals have an octahedral coordination structure. The polarity of the octahedral coordination is determined by the polarity of the AlN substrate. Therefore, the polarity of Group III nitride semiconductor being grown on the octahedral crystals of O and Al is opposite to the polarity of the AlN crystal of the substrate. Thus, Al—O—Al bond inverts the polarity.

The main surface 110$u$ of the substrate 110 is a nitride polar surface (−c plane). That is, the main surface 110$u$ disposed on the upper side of the substrate 110 in FIG. 2 is the nitride polar surface (−c plane).

The polarity is inverted at an interface between the main surface 110$u$ of the substrate 110 and the bottom surface O1$d$ of the oxide film O1. The top surface O1$u$ of the oxide film O1 and the top surface 120$u$ of the first Group III nitride layer 120 are Al polar surfaces (+c plane). That is, in the semiconductor layers above the oxide film O1, the surface on a farther side from the substrate 110 is the Al polar surface (+c plane).

In FIG. 2, the substrate 110 having the nitride polar surface (−c plane) facing upward is slash hatched. The oxide film O1 being a polarity inversion layer is dot hatched

3. Method for Producing Semiconductor Light-Emitting Device

Next will be described the method for producing the light-emitting device 100 of the first embodiment. The semiconductor layers are formed through metal-organic chemical vapor deposition (MOCVD), thereby the semiconductor layers are produced via epitaxial growth. The carrier gas employed in the growth of semiconductor layers include hydrogen ($H_2$), nitrogen ($N_2$), and a mixture of hydrogen and nitrogen ($H_2+N_2$). Ammonia gas ($NH_3$) is used as a nitrogen source, and trimethylgallium ($Ga(CH_3)_3$) as a gallium source. Trimethylindium ($In(CH_3)_3$) is used as an indium source, and trimethylaluminum ($Al(CH_3)_3$) is used as an aluminum source. Silane ($SiH_4$) is used as an n-type dopant gas, and bis(cyclopentadienyl)magnesium ($Mg(C_5H_5)_2$) is used as a p-type dopant gas. Gas other than the above may be employed.

3-1. Cleaning of Substrate

A substrate 110 is cleaned with $H_2$ gas. The main surface 110$u$ of the substrate 110 is a nitride polar surface (−c plane). The substrate temperature is approximately 1100° C. Needless to say, the substrate temperature may be other than this.

3-2. Oxide Film Formation Step

Subsequently, an oxide film O1 is formed on the main surface 110$u$ of the substrate 110. As described above, the main surface 110$u$ is a −c plane. An oxide film containing Al atoms, N atoms, and O atoms is formed as the oxide film O1. For that, the substrate 110 is heated in a temperature range from 200° C. to 400° C. in the atmosphere including oxygen. The heating temperature may be higher than 25° C. Alternatively, the substrate 110 may be left in the atmosphere or an oxygen atmosphere outside the MOCVD furnace. Thus, the polarity is inverted between the substrate 110 and the oxide film O1. Therefore, the top surface O1$u$ of the oxide film O1 is the Al polar surface (+c plane).

3-3. First Group III Nitride Layer Formation Step

Next, a first Group III nitride layer 120 is formed on the oxide film O1. An AlN layer is formed as the first Group III nitride layer 120. At this time, the substrate temperature is within a range of 1200° C. to 1450° C. More preferably the substrate temperature is within a range of 1350° C. to 1450° C. The substrate temperature is higher enough than the growth temperature of the conventional Group III nitride semiconductor light-emitting device. In this temperature range, the AlN with +c growth surface can be easily laterally grown. As a result the AlN with +c polarity can be more uniformly obtained on the entire surface of the substrate 110. That is, the far side surface of the substrate 110 in the grown semiconductor layer tends to be the Al polar surface (+c plane). Therefore, the first Group III nitride layer 120 superior in crystallinity is formed. The carrier gas is preferably nitrogen ($N_2$). As described later, when the growth substrate is a sapphire substrate on which AlN was grown, the sapphire substrate may be etched by using hydrogen ($H_2$) as a carrier gas.

3-4. First Semiconductor Layer Formation Step

3-4-1. n-Type Contact Layer Formation Step

Next, an n-type contact layer 130 is formed on the first Group III nitride layer 120. At this time, the substrate temperature is 900° C. to 1140° C.

3-4-2. n-Side Cladding Layer Formation Step

Subsequently, an n-side cladding layer 150 made of a Si-doped AlGaN layer is formed on the n-type contact layer 130.

3-5. Light-Emitting Layer Formation Step

Then, a light-emitting layer 160 is formed on the n-side cladding layer 150. For that, layer units are repeatedly deposited each formed by depositing a well layer and a barrier layer. After the formation of the well layer, a cap layer may be formed.

3-6. Second Semiconductor Layer Formation Step

3-6-1. p-Side Cladding Layer Formation Step

Next, a p-side cladding layer 170 is formed on the light-emitting layer 160. In this case, p-type AlGaN layers are deposited.

3-6-2. p-Type Contact Layer Formation Step

Subsequently, a p-type contact layer 180 is formed on the p-side cladding layer 170.

3-7. Transparent Electrode Formation Step

Then, a transparent electrode TE1 is formed on the p-type contact layer 180.

3-8. Electrode Formation Step

Subsequently, a p-electrode P1 is formed on the transparent electrode TE1. A part of the semiconductor layers is removed from the p-type contact layer 180 side using a laser or by etching to expose the n-type contact layer 130. Then, an n-electrode N1 is formed on the exposed portion of the n-type contact layer 130. The step of forming the p-electrode P1 may be performed before the step of forming the n-electrode N1, or the step of forming the n-electrode N1 may be performed before the step of forming the p-electrode P1.

3-9. Other Steps

In addition to the steps described above, other steps such as a heat treatment step and an insulating film formation step may be performed. Through the steps described above, the light-emitting device 100 shown in FIG. 1 is produced.

4. Effect of the First Embodiment

The AlN substrate is usually taken out from a production apparatus after the production. In that case, the surface of the AlN substrate is partially and naturally oxidized with oxygen in the atmosphere. Because an oxide film is partially formed on the surface of the AlN substrate, a polarity inversion partially occurs on the surface of the AlN substrate. Thus, variation occurs locally in the degree of the polarity inversion. Therefore, when a Group III nitride semiconductor layer is grown on such an AlN substrate, a portion where Al polarity (+c polarity) is dominant and a portion where N polarity (−c polarity) is dominant were sometimes generated in one layer.

On the other hand, in the first embodiment, the polarity of the entire AlN substrate is inverted by uniformly forming an oxide film containing Al (such as an oxide film O1) in a predetermined thickness on the entire surface of the substrate 110. Thus, since the semiconductor formed on the oxide film has a uniform polarity on the entire surface of the substrate 110, a portion where Al polarity is dominant and a portion where N polarity is dominant can be suppressed from being generated.

The first Group III nitride layer 120 is formed under the condition that the substrate temperature is 1200° C. to 1450° C., more preferably 1350° C. to 1450° C. In this temperature range, AlN is preferably grown. The polarity of the AlN which is grown on the oxide film is equal to the polarity of the octahedral crystals of O and Al of the oxide film. The polarity of the octahedral crystals of O and Al is opposite to the polarity of the substrate. Accordingly, the polarity of the AlN which is grown on the substrate having N polarity (−c polarity) is uniformly Al polarity (+c polarity), i.e., Group III metal polarity. Therefore, the semiconductor layer has a good crystallinity in the light-emitting device 100.

5. Variations

5-1. Flip Chip

Figure 3:
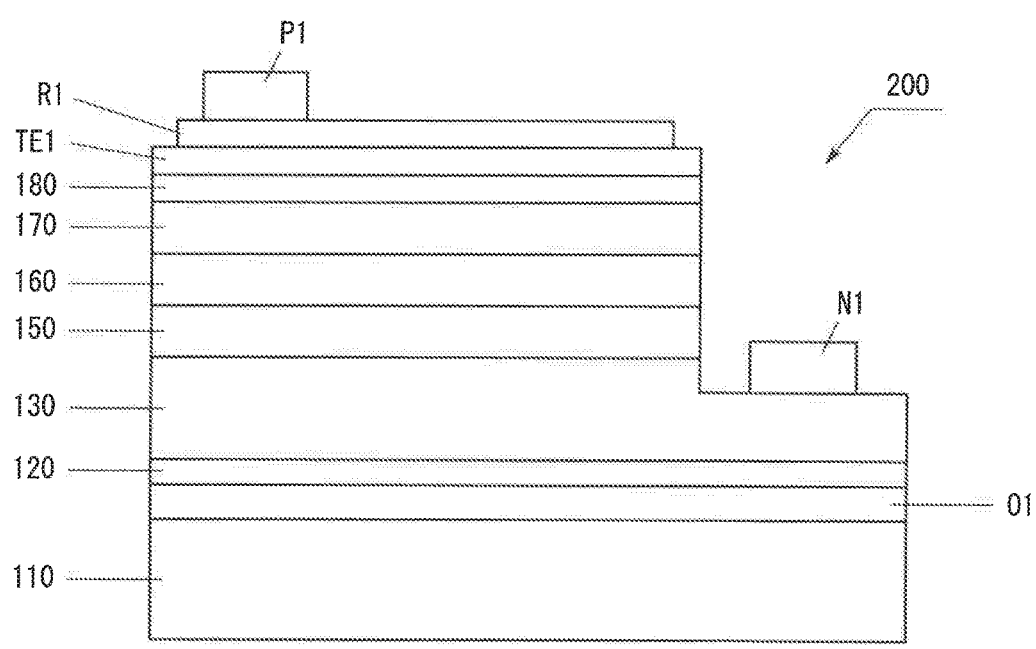
FIG. 3 is a schematic view of the structure of a light-emitting device according to a variation of the first embodiment.

FIG. 3 is a schematic view of the structure of a light-emitting device 200 according to a variation. The light-emitting device 200 is a flip-chip type semiconductor light-emitting device. The light-emitting device 200 has a reflective layer R1. The reflective layer R1 is disposed between the transparent electrode TE1 and the p-electrode P1.

5-2. Substrate Material

In the first embodiment, the substrate 110 is an AlN substrate. However, the substrate 110 may be an AlGaN substrate. The substrate may be a template substrate prepared by forming AlN or AlGaN on a sapphire substrate.

5-3. Oxide Film Material

In the first embodiment, the oxide film O1 is made of AlON. However, the oxide film O1 may be made of oxidized AlGaN. In this case, the oxide film O1 is made of AlGaON. Thus, the oxide film O1 is an oxide containing Al atoms, N atoms, and O atoms.

5-4. First Group III Nitride Layer Material

In the first embodiment, the first Group III nitride layer 120 is made of AlN. The first Group III nitride layer 120 may be made of AlGaN.

5-5. Top Layer of First Group III Nitride Layer

In the first embodiment, the n-type contact layer 130 is formed on the first Group III nitride layer 120. However, any Group III nitride layer may be formed between the first Group III nitride layer 120 and the n-type contact layer 130.

5-6. Layered Structure of Semiconductor Layer

In the first embodiment, the n-type contact layer 130, the n-side cladding layer 150, the light-emitting layer 160, the p-side cladding layer 170, and the p-type contact layer 180 are formed on the first Group III nitride layer 120. However, needless to say, other layered structure may be used. The layers of the above layered structure may have a deposition structure other than that described in the first embodiment.

5-7. Polarity Inversion

In the first embodiment, the surface of the substrate 110 on which the first Group III nitride layer 120 is grown is the nitrogen polar surface (−c plane). The oxide film O1 and the first Group III nitride layer 120, and the semiconductor layers thereabove have the Al polarity (+c polarity). However, the polarity may be inverted. That is, the top surface of the substrate 110 may be the Al polar surface (+c plane). The oxide film O1, the first Group III nitride layer 120, and the semiconductor layers thereabove may have the nitrogen polarity (−c polarity). In that case, the layers may be formed under the condition that the substrate temperature is 850° C. to 1150° C.

5-8. Emission Wavelength

The light-emitting device 100 of the first embodiment is an ultraviolet light-emitting device. However, the light-emitting device may emit light of wavelength other than ultraviolet ray.

5-9. Combination

The above variations may be freely combined.

6. Summary of the First Embodiment

As described above, the light-emitting device 100 of the first embodiment includes the oxide film O1 and the first Group III nitride layer 120. The oxide film O1 inverts the polarity of the base layer. Because the oxide film O1 is uniformly formed on the substrate, the mixture of Group III polar surface and N polar surface can be suppressed in the semiconductor layer being grown. After the polarity of the semiconductor layer is inverted, the first Group III nitride layer is grown at a relatively high temperature. At a temperature of near 1400° C., the Al polar surface (+c plane) tends to be dominantly grown. That is, the semiconductor layers produced by the production method of the first embodiment have good crystallinity.

Notably, the aforementioned embodiments are given for the illustration purpose. Thus, needless to say, various modifications and variations can be made, so long as they fall within the scope of the present technique. The semiconductor layer growth technique is not limited to metal-organic chemical vapor deposition (MOCVD). Other similar techniques may be employed, as long as they employ carrier gas in crystal growth.

What is claimed is:

1. A method for producing a Group III nitride semiconductor light-emitting device, the method comprising:
   forming an oxide film containing Al atoms, N atoms, and O atoms by uniformly oxidizing an entire surface of at least one substrate of an AlN substrate and an AlGaN substrate;
   forming a first Group III nitride layer on the oxide film;
   forming a first conductive type first semiconductor layer on the first Group III nitride layer;
   forming a light-emitting layer on the first semiconductor layer; and
   forming a second conductive type second semiconductor layer on the light-emitting layer,
   wherein, in the forming the first Group III nitride layer, the AlN layer or the AlGaN layer is formed as the first Group III nitride layer under a condition that a temperature of the substrate is 1200° C. to 1450° C.,
   wherein, in the forming the oxide film, AlON or AlGaON is formed as the oxide film for inverting a polarity, and the polarity is inverted between the substrate and the first Group III nitride layer formed on the oxide film by the oxide film, and
   wherein, in the forming the oxide film, octahedral crystals of O and Al are formed as the oxide film.

2. The method for producing a Group III nitride semiconductor light-emitting device according to claim 1, wherein, in the forming the oxide film, the oxide film is formed on a −c plane of the substrate.

3. The method for producing a Group III nitride semiconductor light-emitting device according to claim 1, wherein a thickness of the oxide film is in a range from 3 nm to 100 nm.

4. The method for producing a Group III nitride semiconductor light-emitting device according to claim 1, wherein an Al composition ratio of the first Group III nitride layer is not smaller than 0.5.

5. The method for producing a Group III nitride semiconductor light-emitting device according to claim 1, wherein, in the forming the oxide film, the substrate is heated in a temperature range from 25° C. to 400° C. in an atmosphere including oxygen.

6. The method for producing a Group III nitride semiconductor light-emitting device according to claim 1, wherein the first Group III nitride layer is formed under a condition that the temperature of the substrate is 1350° C. to 1450° C.

7. The method for producing a Group III nitride semiconductor light-emitting device according to claim 6, wherein N atoms of the surface of the substrate are replaced with O atoms, and an Al—O covalent bond is generated on the surface of the substrate.

8. The method for producing a Group III nitride semiconductor light-emitting device according to claim 1, wherein N atoms of the surface of the substrate are replaced with O atoms, and an Al—O covalent bond is generated on the surface of the substrate.

9. The method for producing a Group III nitride semiconductor light-emitting device according to claim 8, wherein in the forming the oxide film, the substrate is heated in a temperature range from 25° C. to 400° C. in an atmosphere including oxygen.

10. A method for producing a Group III nitride semiconductor light-emitting device, the method comprising:
    forming an oxide film containing Al atoms, N atoms, and O atoms by uniformly oxidizing an entire surface of at least one substrate of an AlN substrate and AlGaN substrate;
    forming a first Group III nitride layer on the oxide film;
    forming a first conductive type first semiconductor layer on the first Group III nitride layer;
    forming a light-emitting layer on the first semiconductor layer; and
    forming a second conductive type second semiconductor layer on the light-emitting layer;
    wherein, in the forming the first Group III nitride layer, the AlN layer or the AlGaN layer is formed as the first Group III nitride layer under a condition that a temperature of the substrate is 1350° C. to 1450° C., and
    wherein, in the forming the oxide film, AlON or AlGaON is formed as the oxide film for inverting a polarity and the polarity is inverted between the substrate and the first Group III nitride layer formed on the oxide film by the oxide film.

11. The method for producing a Group III nitride semiconductor light-emitting device according to claim 10, wherein N atoms of the surface of the substrate are replaced with O atoms, and an Al—O covalent bond is generated on the surface of the substrate.

12. A method for producing a Group III nitride semiconductor light-emitting device, the method comprising:
    forming an oxide film containing Al atoms, N atoms, and O atoms by uniformly oxidizing an entire surface of at least one substrate of an AlN substrate and AlGaN substrate;
    forming a first Group III nitride layer on the oxide film;
    forming a first conductive type first semiconductor layer on the first Group III nitride layer;
    forming a light-emitting layer on the first semiconductor layer; and
    forming a second conductive type second semiconductor layer on the light-emitting layer;
    wherein, in the forming the first Group III nitride layer, the AlN layer or the AlGaN layer is formed as the first Group III nitride layer under a condition that a temperature of the substrate is 1200° C. to 1450° C.,
    wherein, in the forming the oxide film, AlON or AlGaON is formed as the oxide film for inverting a polarity, and the polarity is inverted between the substrate and the first Group III nitride layer formed on the oxide film by the oxide film, and
    wherein N atoms of the surface of the substrate are replaced with O atoms, and an Al—O covalent bond is generated on the surface of the substrate.

* * * * *